United States Patent
Kub et al.

(10) Patent No.: US 6,323,108 B1
(45) Date of Patent: Nov. 27, 2001

(54) FABRICATION ULTRA-THIN BONDED SEMICONDUCTOR LAYERS

(75) Inventors: Francis J. Kub, Arnold; Karl D. Hobart, Upper Marlboro, both of MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/373,031

(22) Filed: Jul. 27, 1999

(51) Int. Cl.[7] ............................. H01L 21/30; H01L 21/46
(52) U.S. Cl. ......................... 438/458; 438/406; 438/459
(58) Field of Search .................................. 438/406, 455, 438/456, 457, 458, 459; 156/344, 584

(56) References Cited

U.S. PATENT DOCUMENTS

| | | | |
|---|---|---|---|
| 5,013,681 | * 5/1991 | Godbey et al. | 437/86 |
| 5,024,723 | * 6/1991 | Goesele et al. | 156/628 |
| 5,303,255 | * 4/1994 | Kudo et al. | 372/96 |
| 5,374,564 | 12/1994 | Bruel | 437/24 |
| 5,540,785 | 7/1996 | Dennard et al. | 148/33.2 |
| 5,646,058 | 7/1997 | Taur et al. | 437/40 R |
| 5,681,775 | * 10/1997 | Pogge | 437/62 |
| 5,757,038 | 5/1998 | Tiwari et al. | 257/192 |
| 5,877,070 | * 3/1999 | Goesele et al. | 438/458 |
| 5,882,987 | * 3/1999 | Srikrishnan | 438/458 |
| 5,953,620 | * 9/1999 | Katou et al. | 438/406 |
| 5,980,633 | * 11/1999 | Yamagata et al. | 117/94 |
| 6,004,865 | * 12/1999 | Horiuchi et al. | 438/459 |

* cited by examiner

*Primary Examiner*—John F. Niebling
*Assistant Examiner*—Viktor Simkovic
(74) *Attorney, Agent, or Firm*—John J. Karasek; Jane B. Marciniszyn

(57) ABSTRACT

The invention uses implantation, typically hydrogen implantation or implantation of hydrogen in combination with other elements, to a selected depth into a wafer with that contains one or more etch stops layers, treatment to split the wafer at this selected depth, and subsequent etching procedures to expose etch stop layer and ultra-thin material layer.

A method for making an ultra-thin material layer bonded to a substrate, has the steps: (a) growing an etch stop layer on a first substrate; (b) growing an ultra-thin material layer on the etch stop layer; (c) implanting an implant gas to a selected depth into the first substrate; (d) bonding the ultra-thin material layer to a second substrate; (e) treating the first substrate to cause the first substrate to split at the selected depth; (f) etching remaining portion of first substrate to expose the etch stop layer, and (g) etching the etch stop layer to expose the ultra-thin material layer.

48 Claims, 1 Drawing Sheet

FABRICATION ULTRA-THIN BONDED SEMICONDUCTOR LAYERS

BACKGROUND OF THE INVENTION

1. Field of the Invention

The present invention relates generally to fabrication of ultra-thin bonded semiconductor layers, for electronic applications. In particular, the invention relates to making ultra thin layers for epitaxial growth on a substrate, and for making compliant substrates.

2. Description of the Related Art

Ultra-thin (<10 nm) substrates, including silicon-on-insulator (SOI) substrates, are desirable for many technologies including extreme scaling of MOSFET transistors, dual-gate MOSFETs, quantum wires and dots, and compliant or universal substrates. In the past, ultra-thin semiconductor layers have been produced by successive oxidation and oxide etching of silicon-on-insulator (SOI) wafers. In the oxide thinning technique, an SOI substrate with approximately a 200 nm thick silicon layer is thinned to approximately 50 nm by multiple oxidations and dilute hydrofluoric acid etches. This technique is heavily dependent the thickness uniformity of the SOI silicon layer and the oxidation uniformity. SOI substrates often have a thickness non-uniformity of approximately 10 nm. Thus, the oxidation thinning technique is not suitable for manufacturing ultra-thin (<10 nm) silicon layers.

One method of fabricating silicon-on-insulator (SOI) layer involves bond-and-etch back (BESOI) technique. The BESOI technique involves bonding an etch stop layer to an oxidized silicon handle wafer, thinning the wafer that contains the etch stop layer by grinding, chemically etching to the etch stop layer, and then etching the etch stop layer. A key step in the BESOI process is the method of forming the etch stop layer. A heavily doped (boron concentration $>10^{20} cm^{-3}$) layer has been used as the etch stop layer. U.S. Pat. No. 5,540,785 to Dennard et al describes a method for making SOI structures using a heavily boron-doped etch stop layer that has a small percentage of germanium added to produce a defect-free epitaxial layer. U.S. Pat. No. 5,013,681 to Godbey et al describes a method to fabricate SOI structures that uses a strained SiGe etch stop. U.S. Pat. No. 5,024,723 to Goesele et al describes a method to fabricate SOI structures by implanting carbon ions into a substrate to form an etch stop layer. The disadvantage of all the BESOI approaches is that the entire host substrate must be removed by a laborious sequence of grinding, polishing, and etching. In addition, overall thickness uniformity during the substrate thinning process must be critically maintained since the etch selectivity of Si over SiGe is limited.

U.S. Pat. No. 5,374,564 to Bruel describes another method of fabricating a silicon-on-insulator (SOI) layer that involves combining wafer bonding with a hydrogen implantation and separation technique. The hydrogen implantation and separation technique utilizes a heavy dose of implanted hydrogen together with subsequent annealing to produce H exfoliation that releases the host substrate to generate the SOI structure. The surface following exfoliation has a microroughness of about 8 nm, and must be given a slight chemomechanical polish to produce a prime surface. This step degrades the Si layer thickness uniformity and makes the process unsuitable for producing very thin Si films.

It has been found experimentally that there are a number of techniques to either reduce the required hydrogen ion implantation dose or to reduce the temperature needed to cause hydrogen ion implantation substrate layer splitting process to work. One technique involves the use of a high pressure nitrogen gas stream directed towards the side of a silicon substrate into which a high dose hydrogen ion implantation has been made. It has been experimentally found that the hydrogen ion implantation substrate layer splitting process can occur at room temperature for the case of a silicon substrate into which a high hydrogen ion implantation dose has been made using the high pressure nitrogen gas stream method. It has also been found experimentally that a helium ion implantation made in combination with a hydrogen ion implantation can be used to achieve a lower total implanted dose for the substrate layer splitting process to occur for a given anneal temperature. It has also been found experimentally that helium ion implantation can be used instead of hydrogen ion implantation for the substrate layer splitting process. It has also been found experimentally that a lower substrate layer splitting temperature is achieved for the case that a hydrogen ion implantation is made into a silicon substrate having a high boron concentration. The high boron concentration can be incorporated into a silicon substrate by ion implantation. The lower temperature for hydrogen ion implantation substrate layer splitting to occur is obtained both for the case that the boron implant is annealed and for the case that the boron implant is unannealed.

Dual-gate MOSFETs have gates located both above and below the conducting channel; a silicon conducting channel with a layer thickness of <10 nm is predicted to be necessary for transistors with conventional lateral dimensions. U.S. Pat. No. 5,273,921 to Neudeck describes a method for fabricating a dual-gate MOSFET that uses the epitaxial lateral overgrowth of mono-crystalline silicon to form the channel. U.S. Pat. No. 5,646,058 to Taur et al describes a method of fabricating a self-aligned double-gate MOSFET by selective lateral epitaxy. U.S. Pat. No. 5,757,038 to Tiwari et al describes a method to fabricate a dual-gate MOSFET that has a vertical conducting channel. The methods for forming a dual-gate transistor involve complicated lateral epitaxial growth.

Ultra-thin semiconductor layers are required for compliant substrates. In structures with a compliant substrate, the ultra-thin semiconductor layer will expand or contract as a heteroepitaxially layer is grown on the surface of the ultra-thin semiconductor layer so that defects, if created, will reside in the ultra-thin semiconductor layer. The principal technique investigated to date for complaint substrate growth is the twist bonding technique and epitaxial growth on SOI substrates with thick ($\geq 100$ nm) Si films.

An n-channel SiGe Modulation Doped Field Effect Transistors (MODFET) is desirable because of high electron mobility. The n-channel requires a SiGe/Si heterojunction with the offset in the conduction band. To achieve this offset, a structure has been proposed in which a thin silicon layer is strained and the SiGe is relaxed. To fabricate such a structure, a relaxed SiGe buffer layer is required. The approach that has been pursued to date to produce such a relaxed SiGe buffer layer is to grow a stair-cased superlattice of SiGe and Si. The staircase superlattice approach has not been entirely satisfactory because of defects in the superlattice layer.

Thin layers of GaAs have been produced lateral undercutting a AlAs layer and then transferring an epitaxial layer to another substrate, with etch stop techniques. Typically, only small areas (<100 $\mu$m square) of thin GaAs can be transferred using the epitaxial lift-off techniques and thus this technique is not suitable for full wafer transfer. In the etch stop technique, the wafer is thinned from the backside to within approximately 50 μm of the etch stop layer and then the GaAs substrate is etched stopping at an AlGaAs etchstop. The AlGaAs etchstop is next etched leaving a thin semiconductor layer. The etch stop technique suffers from non-uniform etching of the etch stop layer.

It is desired to grow arbitrarily thick epitaxial layers on compliant substrates. Lattice mismatch between a compliant substrate and the epitaxial growth layer creates a critical thickness limitation on the growth of the epitaxial layer.

SUMMARY OF THE INVENTION

Accordingly, it is an object of this invention to provide an improved method of fabrication ultra-thin material layers, especially semiconductor layers, so that the thin semiconductor layer can be used in a wide number of applications, including silicon-on-insulator (SOI) substrates, compliant substrates, strain relaxed complaint substrate, dual-gate metal oxide semiconductor field effect transistor (MOSFET), SiGe photodetectors, and SiGe MODFETs.

Another object of this invention is to provide a method to fabricate a strained relaxed compliant substrate.

Another object of this invention is to provide a method to fabricate an ultra-thin semiconductor layer that is direct bonded to a microwave insulating substrate to enable the lattice matched pseudoepitaxial growth of semiconductor layers suitable for the fabrication of microwave electronic devices.

Another object of this invention is to provide a semiconductor that uses a relaxed buffer layer suitable for SiGe MODFETs or SiGe photodetectors formed by the strained relaxed compliant substrate approach.

These and additional objects of the invention are accomplished by the structures and processes hereinafter described.

The invention uses implantation, typically hydrogen implantation or implantation of hydrogen in combination with other elements, to a selected depth into a wafer that contains one or more etch stops layers, treatment to split the wafer at this selected depth, and subsequent etching procedures to expose etch stop layer and ultra-thin material layer.

An aspect of the present invention is a method for making an ultra-thin material layer bonded to a substrate, having the steps: (a) growing an etch stop layer on a first substrate; (b) growing an ultra-thin material layer on the etch stop layer; (c) implanting an implant ion to a selected depth into the first substrate; (d) bonding the ultra-thin material layer to a second substrate; (e) treating the first substrate to cause the first substrate to split at the selected depth; (f) etching remaining portion of first substrate to expose the etch stop layer, and (g) etching the etch stop layer to expose the ultra-thin material layer.

Another aspect of the invention is a method for making an ultra-thin material layer compliantly bonded to a substrate, having, the steps: (a) growing an etch stop layer on a first substrate; (b) growing an ultra-thin semiconductor layer on the etch stop layer; (c) optionally growing or depositing a material layer (such as a low viscosity oxide layer or silicon oxide to provide a low interface density at the ultra-thin semiconductor layer surface for SOI application) on the ultra-thin semiconductor layer; (d) implanting an implant ion (typically hydrogen or hydrogen in combination with other elements) to a selected depth into the first substrate; (e) optionally depositing a material layer including such material layers as a low viscosity oxide, glass, metal or polymer material on the first substrate; (f) compliantly bonding the ultra-thin semiconductor layer to a second substrate that may have a low viscosity material deposited on its surface; (a) treating the first substrate having implanted ion to cause the first substrate to split at the selected depth; (h) etching the remaining portion of the first substrate to expose the etch stop layer ; (I) etching the etch stop layer to expose the ultra-thin semiconductor layer; (j) optionally etching grooves at selected lateral separations through the compliant layer that will allow the compliant layer to expand or contract upon heating; and (k) growing an epitaxial layer on the compliantly bonded layer using either selective growth techniques or if the grooves are sufficiently deep, non-selective growth techniques.

Another aspect of the invention is a method for making a semiconductor structure with an ultra-thin lattice matched relaxed layer between a semiconductor and a substrate, having the steps of: (a) growing a pseudomorphic epitaxial layer on a substrate, to a thickness less than a critical thickness for defect formation; (b) implanting an implant ion to a selected depth into the substrate; (c) optionally depositing a material layer including such material layers as a low viscosity oxide, glass, metal or polymer material on the first substrate; (d) compliantly bonding the pseudomorphic epitaxial layer to a second substrate; (e) treating the first substrate having implanted ion to cause the first substrate to split at the selected depth; forming a freestanding portion of the first substrate, separated from a remaining portion of the first substrate, the remaining portion being compliantly bonded to the second substrate; (f) etching the remaining portion of the first substrate, thereby exposing the pseudomorphic epitaxial layer; (g) optionally etching grooves at selected lateral separations through the pseudomorphic epitaxial layer that will allow the pseudomorphic epitaxial layer to expand or contract upon heating; (h) heating the pseudomorphic epitaxial layer to a temperature to relax strain in the pseudomorphic epitaxial layer; and (I) growing an epitaxial layer on the compliantly bonded layer using either selective growth techniques or if the grooves are sufficiently deep, non-selective growth techniques.

It should be understood that in the above described approaches, the second substrate can be selected to have low microwave loss for microwave application, selected to be insulating, selected to have high thermal conductivity for power device application, selected to have a coefficient of thermal expansion that closely matched the coefficient of thermal expansion of a epitaxial layer that is grown on the ultra-thin layer, selected because it is optically transparent for such application as light emitting diodes, selected because of large diameter substrates being available, selected for ease of manufacturing, or selected because of cost. The second substrate may also have material layers deposited or grown on the surface such as silicon oxide, silicon nitride, tantalum oxide, polysilicon or other materials.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

Figure 1:
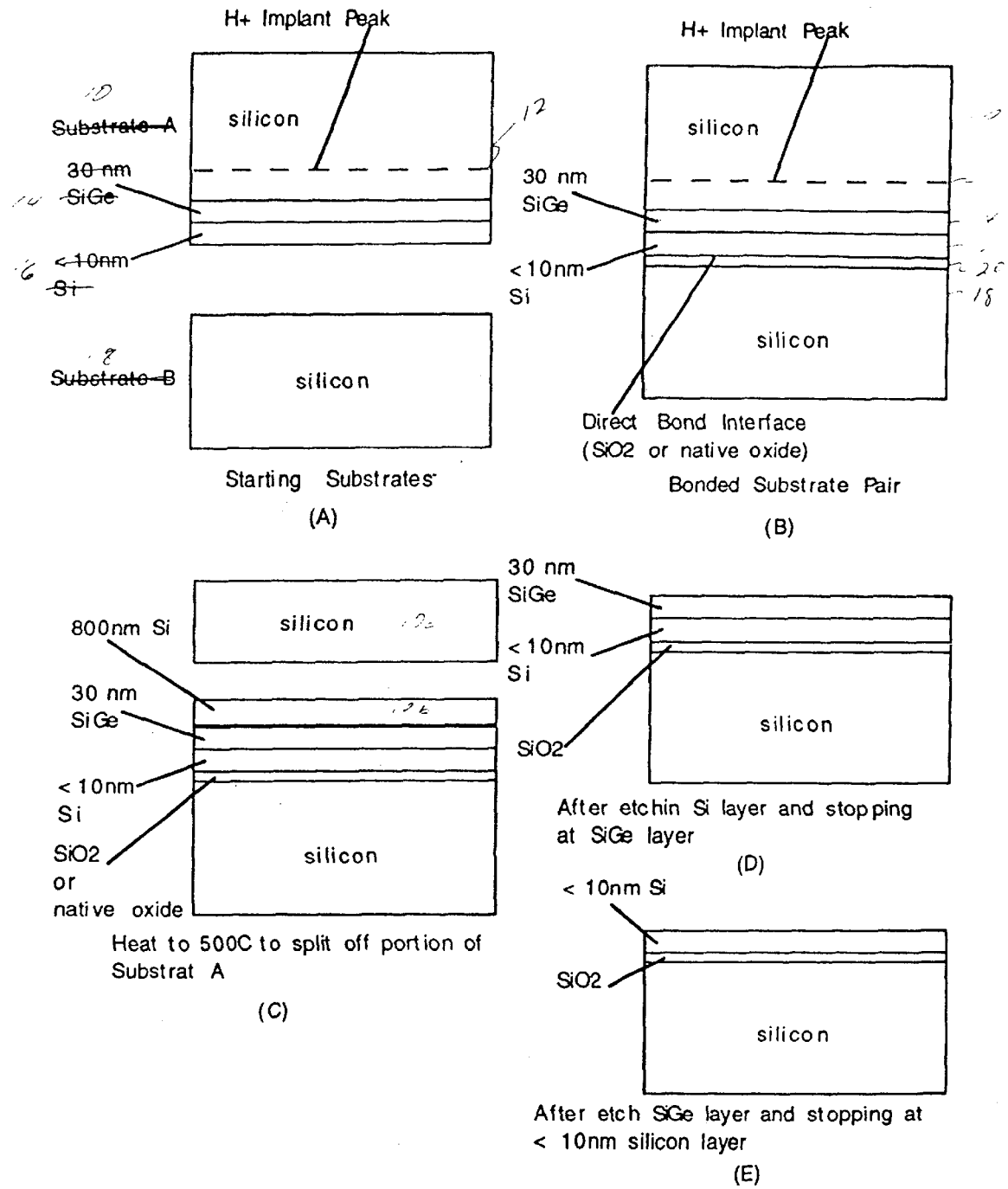
FIG. 1 shows the sequence of steps for making an ultra-thin direct bonded semiconductor layer.

As noted above, the invention uses hydrogen implantation to a selected depth into a wafer that contains one or more semiconductor etch stops layers, and subsequent heat treatment to split the wafer at this selected depth. The etch stop layer can be grown using techniques that can control the thickness of the grown layers to within 1 nm layer thickness, including molecular beam epitaxy (MBE), metal organic chemical vapor deposition (MOCVD), and ultra-high vacuum chemical vapor deposition (UHVCVD).

Most of the description below discusses silicon wafers. However, the same techniques may be used for the III–V semiconductors as well.

Referring to FIG. 1, an exemplary process for making an ultra-thin semiconductor directly bonded to a substrate has the following steps:

As shown in 1(A), growing an etch stop layer 14 on a first substrate 10, is followed by the epitaxial growth of an ultra-thin Si cap layer 16. The etch stop layer is typically between about 20 nm and about 40 nm thick, more typically about 30 nm thick. Typical etch stop materials compatible with silicon substrates include SiGe, SiGeC, SiC, boron-doped Si (boron implanted into Si), carbon-doped Si, nitrogen-doped Si, and oxygen-doped Si. Laser gas source doping, vapor phase doping, low energy ion implantation, and diffusion from doped oxides can be used to form ultra thin layers of high boron concentration on the surface of the first substrate, which can act as an etch stop. Ultra-thin high concentration p-type doped layers can be formed on the first substrate by epitaxial growth.

Typical etch stop materials compatible with GaAs substrates include epitaxially grown AlAs, AlGaAs, GaPAs, InAlAs, and oxidized AlAs. Typical etch stop materials compatible with InP substrates include InAlAs. Typical etch stop materials compatible with GaSb substrates include InAs, InSbAs and, AlSb. Typical etch stop materials compatible with InAs substrates include GaSb and AlSb. Typical etch stop material compatible with $SrTiO_3$ substrates include YBCO.

The cap layer thickness can be adjusted depending on the application. For extreme scaling MOSFETs, dual-gate MOSFETs, and compliant substrate layers, the cap layer is typically less than 10 nm thick, more preferably less than 6 nm thick. The cap layer can have additional material layers grown on the cap layer, such as silicon oxide, that is needed for SOI substrate formation. Besides Si, other ultra-thin cap materials that may be used include GaAs and other III–V semiconductors. In alternative embodiments of the invention, the etch stop layer will serve as the ultra-thin bonded layer, so there is no need for the ultra-thin cap layer. In these embodiments of the invention, the etch stop layer 14 may be thinner than the otherwise preferred of about 30 nm. For example, the etch stop layer 14 may be less than about 10 nm. An exemplary etch stop material for these alternative applications is ultra-thin SiC, which may be formed on a silicon surface by carbonization. For these alternative embodiments, the etch stop layer 14 will be processed as the ultra-thin layer, as described below.

Hydrogen is implanted into the first substrate 10. Implanted hydrogen will vary in concentration, following a profile determined by the conditions of implantation. Thus, it is possible to implant hydrogen in a way that it will have an implant peak 12 at a selected depth in the substrate. Typical implantation depths will range from about 50 nm to about 20,000 nm for an ion implanter tool with less than 200 KeV energy capability. A preferred depth is about 800 nm into the silicon wafer, which may be effected by an implantation energy of about 90 keV, with a dose of about $5\times10^{16}$ $cm^{-2}$.

Preferably, the ultra-thin layer 16 and the second substrate 18 are prepared for bonding. The method of preparation will depend on the method of bonding. For direct bonding, the preparation steps will include cleaning the surfaces of organics by. e.g., treatment with RCA1, piranha, plasma, or UV ozone. The surfaces are then treated, if necessary, to have the desired surface chemistry for direct bonding. Direct bonding can take place between two hydrophilic surfaces (preferred), between two hydrophobic surfaces, or between a hydrophilic and a hydrophobic surface. A hydrophilic second substrate 18 may have a native oxide surface (about 10 Å thick), or a grown oxide layer (typically $SiO_2$), or may be treated (chemically, by plasma treatment, etc.) to have surface —OH groups. Likewise, the ultra-thin layer 16 may be treated to have a hydrophilic surface.

Hydrophilic/hydrophilic direct bonds are typically preferred, due to their good bond strength, especially for direct bonds formed at low temperatures (e.g., <500° C.). Other surface chemistries may be used, and skilled practitioners will employ known techniques to effect these chemistries, e.g., to provide hydrogen-terminated surfaces for hydrophobic chemistries.

As shown in 1(B), the ultra-thin layer 16 and the second substrate 18 are brought into contact under conditions for forming a direct bond 20. Typically, this will entail pressure, and optionally elevated temperature (above room temperature). A low temperature anneal (typically between about 200° C. and about 300° C., preferably about 250° C.) is typically used to increase the direct bond strength. Pressure is especially useful if the surface is rough (e.g., 2 about 5 Å rms surface roughness). Typical pressures are on the order of ten to several hundred psi.

As an alternative to direct bonding, other bonding techniques may be used. For instance, the wafers may be bonded using anodic bonding, adhesive, polymer bonding, cold welding, soldered together, e.g., with an indium or tin solder, etc.

As shown in 1(C), the structure is heated so the hydrogen implanted in the first substrate expands, and thereby causes the first substrate to split along a cleavage line defined by the hydrogen implant peak. This leaves a thin portion 10a (typically about 800 nm) of the first substrate, as well as the rest of the structure on the first substrate, attached to the second substrate, and the rest of the first substrate is left as a freestanding wafer 10b.

As shown in 1(D), the portion 10a of the first substrate attached to the second substrate 18 is etched away, leaving the etch stop layer 14 exposed. The etchant may be any preferential etchant for Si (assuming an Si substrate).

As shown in 1(E), the etch stop layer 14 is etched away, leaving the ultra-thin layer 16 directly bonded to the second substrate 18. The etchant may be any etchant for the etch stop layer. Optionally, a high temperature anneal (typically>about 900° C.) may be used in increase the bond strength between the ultra-thin layer and the substrate.

In addition to silicon substrate, the III–V materials, particularly GaAs, may be used as handle substrates. Other available handle substrates include sapphire. SIC, InP, InGaAs, InAs, GaSb, and lithium niobate. Non-crystalline or polycrystalline materials may likewise be used as the handle substrate, such as quartz, SIC ceramic, poly-SiC, diamond, AlN ceramic, poly-AlN, glass, polysilicon, polymer and stainless steel. It should be understood that in the above described approaches, the second substrate can be selected to have low microwave loss for microwave applications, selected to be insulating, selected to have high thermal conductivity for power device applications, selected to have a coefficient of thermal expansion that closely matched the coefficient of thermal expansion of a epitaxial layer that is grown on the ultra-thin layer, selected because it is optically transparent for such application as light emitting diodes, selected because of large diameter substrates being available, selected for ease of manufacturing, or selected because of cost. The second substrate may also have material layers deposited or grown on the surface such as silicon oxide, silicon nitride, tantalum oxide, polysilicon or other materials.

Several etch stop layers, with intervening layers of substrate material, may be used instead of a single etch stop. The etch stops may be made progressively thinner as they are positioned closer to the ultra-thin layer: the etch stop closest to the ultra-thin layer may be very thin (e.g., <20 nm), since there will be generally only a thin (e.g., about 20 nm) layer of material between the two etch stops to be etched. Etch stops further from the ultra-thin layer will be thicker, especially the etch stop adjacent to the hydrogen implant layer, which will typically be several hundred nm thick. Combination of several etch stop materials can be used such as combination of boron doped silicon and SiGe or SiGeC to allow multiple sequential etch stop etching processes to provide enhanced selectivity in etching.

As noted above, another aspect of the invention is the making of compliant layers on substrates. As used in the art, compliant generally means that a layer will expand or contract during the epitaxial growth of another layer, to match the lattice constant of that layer, or that defects occurring during subsequent epitaxial growth will be confined to the compliant layer, and will not propagate into the epitaxially grown layer. It is desired to prepare compliant substrates for epitaxial growth that are thin enough to be compliant: they will expand upon heating, and slip relative to the other layers. In the present invention, this entails an ultra-thin layer that is direct bonded to a low viscosity material layer such as oxides doped with boron, phosphorous, alkali ion, or lead, polymers with low glass transition temperatures, or metals with low melting temperatures. The use of these low viscosity oxide films with compliant substrates allows the oxide to "flow" and the compliant layer can then expand or contact to match the lattice constant of the epitaxial film. Alternately, the ultra-thin compliant layer can be weakly bonded, typically by van der Waals bonds, to a supporting substrate. This is achieved by basically the same method outlined above, except the additional cap layer is optional, and the etch stop layer may serve as the compliant layer.

Typically, van der Waals bonding will involve hydrogen-to-hydrogen bonds, so hydrophobic surfaces will be desired. Alternatively, hydrophilic surfaces may be used, or one bonded surface may be hydrophobic while the other is hydrophilic. For hydrophilic bonding, the primary type of bonding is OH for temperatures less than approximately 800° C. It has been discovered that the hydrophilic bond energy remains low until approximately 800° C., and then begins to increase as the OH bonds are broken because of the added thermal energy. Thus, for a weakly bonded compliant substrate approach, hydrophobic surface preparation is preferred if the epitaxial growth temperature is<about 500° C., whereas hydrophilic is preferred if the epitaxial growth temperature is <about 800° C.

Another approach is to incorporate specific atoms or molecules at the insulator-compliant layer interface, so that the compliant and substrate layers are bonded by weak covalent or ionic bonds. Examples are GeO and GaO. Ge and Ga form relatively weak bonds to oxides. So if an ultra-thin SiGe is directly bonded to an SiO layer, a significant density of the bonds should be weak Ge—O bonds. The $SiO_2$ layer may also be doped with $P_2O_5$, $B_2$, $O_3$, NaO, and other oxides that have the effect of reducing the viscosity of the SiO, film. The use of these low viscosity oxide films with compliant substrates allows the oxide to "flow" and the compliant layer can then expand or contact to match the lattice constant of the epitaxial film.

As noted above, another aspect of the invention is the making of strained relaxed layers for subsequent epitaxial growth. This aspect of the invention builds upon the preceding aspect of the invention. In this aspect of the invention, the compliant layer is heat treated prior to epitaxial growth, to improve the lattice matching between the compliant layer and the growth layer, inhibiting the formation of defects in the growth layer. In this aspect of the invention, the transferred layer is an ultra-thin strained pseudomorphic layer, and is grown to less than the critical thickness for defect formation. Optionally, a cap layer (typically <about 3 nm) for providing the desired chemical termination is grown over the strained pseudomorphic layer.

After etching down to the ultra-thin layer, relaxation is achieved by appropriate heating for the particular ultra-thin material. For SiGe, heating to about 600° C. to about 900° C. will relax the compliant layer.

For all of the foregoing methods, it will sometimes be desirable to fabricate grooves to allow the ultra-thin layer to expand without buckling.

Having described the invention, the following examples are given to illustrate specific applications of the invention, including the best mode now known to perform the invention. These specific examples are not intended to limit the scope of the invention described in this application.

EXAMPLE 1

The process sequence is shown in FIG. 1. 100 mm diameter, 10 Ω-cm, n-type, (100) orientation substrates were thermally oxidized in dry $O_2$ to produce 120 nm of $SiO_2$ for "handle" wafer fabrication. On similar starting substrates, Si and $Si_xGe_{1-x}$ films were epitaxially grown by chemical vapor deposition to form the "host" substrate. The nominal layer specifications were 20 nm Si buffer followed by 30 nm $Si_{0.7}Ge_{0.3}$ and 4 nm Si. All layers were B-doped $\sim 1 \times 10^{15}$ $cm^{-3}$. Following heteroepitaxial growth the host substrate was inspected by Nomarski interference contrast microscopy, and the films were observed to be extremely smooth and particulate free. The host substrate was implanted at room temperature with $H_2^+$ with an ion energy of 180 keV and a dose of $4.5 \times 10^{16}$ $cm^{-2}$. Handle and host substrates were rendered hydrophilic by $NH_4OH:H_2O_2:H_2O::1:1:4$ and $HCl:H_2O_2:H_2O::1:1:4$ cleaning procedures. After a final rinse in de-ionized water the wafers were spun dry. Wafer bonding was performed in a class 100 laminar flow bench using a custom designed jig to align the major wafer flats. Infrared transmission imaging showed the existence of several macrovoids near the wafer edge, otherwise the bonded pair was void-free. The wafer pair was annealed at 250° C. for 4 hrs to improve bond strength. To separate the host substrate from the etch stop layer and handle wafer, the wafer pair was heated to 550° C. for 10 min in $N_2$. Separation of the host substrate left ~800 nm of Si (including the SiGe etch stop and Si capping layer) on the $Si_2$ film with a mean surface roughness of ~5–7 nm as measured by stylus profilometry. Film separation was successful over the entire 100 mm wafer. Nomarski microscopy showed the existence of a low density (1–10 cm$^{-2}$) of protrusions (~100 μm in diameter and 3 μm high) as well as a textured surface resulting from the exfoliation process. No microvoids were observed in the separated film. Aqueous KOH (10% by wt) was then used to etch the Si and stop at the SiGe. The etch rate for Si at room temperature was found to be ~30 nm/min and the etch selectivity to $Si_{0.7}Ge_{0.3}$ was found to be ~20. Following the Si etch Nomarski microscopy revealed no detectable surface roughness. The films were specular and extremely uniform to the eye. The protrusions observed prior to etching became microvoids through which the $SiO_2$ was visible and are believed to be the result of gas (possibly water) trapped at the bonded interface. Since the etch rate of $SiO_2$ was negligible in KOH, the Si+SiGe film thickness was measurable by stylus profilometry across the microvoids. The film thickness was found to be 35.5±0.5 nm over 4 cm$^2$. X-ray photoelectron spectroscopy (XPS) indicated that the actual etch stop composition was closer to $Si_{0.68}GeO_{0.32}$. The SiGe layer was then selectively removed in a solution of $HF:H_2O_2:CH_3COOH$ (1:2:3). The etch rate of $Si_{0.7}Ge_{0.3}$ was found to be ~100 nm/min at room temperature and the etch selectivity to Si was nearly 1000. Examination by Nomarski microscopy revealed no detectable surface features (other than the low density of microvoids) and the film appeared specular and uniform to the eye.

The ultra-thin SOI films were further characterized by XPS and high-resolution cross-sectional transmission electron microscopy (HRXTEM). The Si film thickness was estimated with XPS by measuring the attenuation of Si 2p core level electrons from the buried $SiO_2$. This peak is unambiguously identified since the binding energy is chemically shifted by +4.5 eV with respect to Si 2p electrons in bulk Si. From the known inelastic mean free path of Si 2p electrons in Si (2.1 nm) and the measured attenuation of the signal (92.4%), the Si thickness was estimated to be 5.2±0.5 nm. Ge 2p electrons were also detected with an intensity equivalent to that produced by a 5.0 nm thick $Si_{0.98}Ge_{0.02}$ alloy with uniform Ge concentration. The actual Ge profile was not determined but its existence is possibly the result of surface segregation during heteroepitaxial growth. HRXTEM was performed on the as-fabricated ultra-thin SOI structure. From TEM it was determined that the Si thickness was closer to 4.0 nm and was uniform to within 20% over the sample studied.

Obviously, many modifications and variations of the present invention are possible in light of the above teachings. It is therefore to be understood that, within the scope of the appended claims the invention may be practiced otherwise than as specifically described.

What is claimed is:

1. A method for making an ultra-thin material bonded to a substrate, comprising the steps:

growing an etch stop layer on a first substrate;

growing an ultra-thin material layer on said etch stop layer;

implanting an implant ion to a selected depth into said first substrate;

bonding said ultra-thin material layer to a second substrate;

splitting said first substrate at said selected depth; thereby forming a freestanding portion of said first substrate, separated from a remaining portion of said first substrate; and heating to a temperature less than 650° C.

2. The method of claim 1, wherein said implant ion comprises a ion selected from the group consisting of hydrogen, helium, and combinations thereof.

3. The method of claim 2, wherein said implant ion comprises hydrogen, and further comprises boron.

4. The method of claim 1, wherein said splitting further comprises heating said first substrate having implanted ions to a temperature wherein said implant ion expands, causing said first substrate to split at said selected depth.

5. The method of claim 1, wherein said method further comprises the step of:

etching said remaining portion of said first substrate, thereby exposing said etch stop layer.

6. The method of claim 5, wherein said method further comprises the step of:

etching said etch stop layer, thereby exposing said ultra-thin material layer.

7. The method of claim 1, wherein said ultra-thin material is an ultra-thin semiconductor.

8. The method of claim 7, further comprising the step of:

forming an oxide on said ultra-thin semiconductor, prior to said bonding step.

9. The method of claim 1, further comprising the step of:

depositing an additional material layer on said ultra-thin material, prior to said bonding step, and either before or after said implanting step.

10. The method of claim 9, wherein said deposited additional layer is low in viscosity.

11. The method of claim 1, wherein said step of bonding said ultra-thin material layer to said second substrate comprises direct bonding said ultra-thin material layer to said second substrate.

12. The method of claim 11, wherein said ultra-thin material layer has a hydrophilic face and said second substrate has a hydrophilic face.

13. The method of claim 12, wherein said hydrophilic face on second substrate is an oxide face.

14. The method of claim 13, wherein said oxide face is a native oxide face.

15. The method of claim 11, wherein said ultra-thin material layer has a hydrophobic face and said second substrate has a hydrophobic face.

16. The method of claim 11, wherein said ultra-thin material layer has a hydrophilic face and said second substrate has a hydrophobic face.

17. The method of claim 11, wherein said ultra-thin material layer has a hydrophobic face and said second substrate has a hydrophilic face.

18. The method of claim 1, wherein said step of bonding said ultra-thin material layer to said second substrate comprises bonding said ultra-thin material layer to said second substrate with an adhesive.

19. The method of claim 18, wherein said adhesive is a solder.

20. The method of claim 19, wherein said solder is selected from the group consisting of indium, tin, other metals, and combinations thereof.

21. The method of claim 1, wherein said selected depth for implanting said hydrogen is between about 500 Å and about 22,000 Å.

22. The method of claim 1, wherein said second substrate has one or more of the properties selected from the group consisting of thermal conductivity, microwave insulation, optical transparency, and thermal expansion coefficient matched to the thermal expansion coefficient of said ultra-thin material.

23. A method of making an ultra-thin material bonded to a substrate, comprising the steps:

implanting an etch stop material in a first substrate, thereby forming an ultra-thin doped layer on said substrate;

implanting hydrogen to a selected depth into said first substrate below said doped layer;

bonding said ultra-thin doped layer to a second substrate;

splitting said first substrate at said selected depth; thereby forming a freestanding portion of said first substrate, separated from a remaining portion of said first substrates; and heating to a temperature less than 650° C.

24. The method of claim 23, wherein said etch stop material and said first substrate are selected from the group consisting of (a) an SiGe etch stop layer and an Si first substrate, and (b) an InAs etch stop layer with a cap layer over said etch stop layer, and a GaSb first substrate.

25. The method of claim 23, wherein said etch stop material is selected from the group consisting of boron, carbon, nitrogen, and combinations thereof.

26. The method of claim 23, wherein said etch stop material is implanted to a concentration on the order of $10^{20}$ atoms/cm$^3$.

27. The method of claim 23, wherein said etch stop material is implanted to a depth of between about 40 Å and about 60 Å.

28. A method for making an ultra-thin material compliantly bonded to a substrate, comprising the steps:

preparing a first layer of a first, a second substrate or material layer for a weak bond;

growing an etch stop layer on said first substrate;

growing an ultra-thin material layer on said etch stop layer;

implanting hydrogen to a selected depth into said first substrate;

compliantly bonding said ultra-thin material layer to said second substrate; and splitting said first substrate at said selected depth; thereby forming a freestanding portion of said first substrate, separated from a remaining portion of said first substrate, said remaining portion being compliantly bonded to said second substrate.

29. The method of claim 28, wherein said step of compliantly bonding said ultra-thin material layer to said second substrate is preceded by a step of cleaning said second substrate and said ultra-thin material layer to remove organics.

30. The method of claim 28, wherein said step of compliantly bonding said ultra-thin material layer to said second substrate comprises bonding said material layer to said second substrate by van der Waals forces.

31. The method of claim 30, wherein said step of compliantly bonding said ultra-thin material layer to said second substrate is preceded by a step of chemically modifying said second substrate and said ultra-thin material layer so that both are hydrophilic, both are hydrophobic, or one is hydrophilic and one is hydrophobic.

32. The method of claim 28, wherein said step of compliantly bonding said ultra-thin material layer to said second substrate comprises binding said material layer to said second substrate by ionic bonding.

33. The method of claim 28, wherein said step of compliantly bonding said ultra-thin material layer to said second substrate comprises bonding said material layer to said second substrate by covalent bonds selected from the group of Ge—O bonds, Ga—O bonds, and bonds that are weaker than Ge—O or Ga—O.

34. The method of claim 28, further comprising the step of etching away said remaining portion of said first substrate to expose said etch stop layer.

35. The method of claim 34, further comprising the step of etching away said etch stop layer.

36. The method of claim 28, further comprising the step of forming grooves in said etch stop layer, for permitting said etch stop layer to laterally expand without buckling during heating.

37. A method for making a structure with an ultra-thin lattice matched relaxed layer between a material layer and a substrate, comprising the steps:

growing a lateral selective pseudomorphic epitaxial layer on a first substrate, to a thickness less than a critical thickness for defect formation;

implanting ions to a selected depth into said first substrate;

compliantly bonding said pseudomorphic opitaxial layer to a second substrate;

splitting said first substrate at said selected depth; thereby forming a freestanding portion of said first substrate, separated from a remaining portion of said first substrate, said remaining portion being compliantly bonded to said second substrate;

etching said remaining portion of said first substrate, thereby exposing said pseudomorphic epitaxial layer;

forming grooves at selected lateral separations through said pseudomorphic epitaxial layer; and heating said pseudomorphic epitaxial layer to a temperature to relax strain in said pseudomorphic epitaxial layer.

38. The method of claim 37, wherein said step of compliantly bonding said ultra-thin material layer to said second substrate is preceded by a step of cleaning said second substrate and said ultra-thin material layer to remove organics.

39. The method of claim 37, wherein said step of compliantly bonding said ultra-thin material layer to said second substrate comprises binding said material layer to said second substrate by van der Waals bonds.

40. The method of claim 39, wherein said step of compliantly bonding said ultra-thin material layer to said second substrate is preceded by a step of chemically modifying said second substrate and said ultra-thin material layer so that both are hydrophilic, both are hydrophobic, or one is hydrophilic and one is hydrophobic.

41. The method of claim 37, further comprising the step of:

growing an etch stop layer on said substrate, prior to said step of growing a pseudomorphic epitaxial layer on said substrate.

42. A method for making material layer bonded to a substrate comprising the step:

selecting a substrate with surface roughness of less than 10 Å;

growing an etch stop layer on a first substrate, growing a material layer on said etch stop layer;

implanting an implant ion to a selected depth into said first substrate;

bonding said material layer to a second substrate;

splitting said first substrate at said selected depth thereby forming a freestanding portion of said first substrate, separated from a remaining portion of said first substrate; and removing said remaining portion of said first substrate and said etch stop layer, wherein said material layer has a surface roughness of 10 Å rms.

43. The method of claim 42, further including the step of annealing at a temperature of 400° C. or below.

44. The method of claim 42, wherein said material layer has a thickness less than 500 Å.

45. The method of claim 1, further including the step of removing said remaining portion of said first substrate and said etch stop layer and wherein said material layer has a surface roughness of <10 Å rms.

46. The method of claim 23, further including the step of removing said remaining portion of said first substrate and said etch stop layer and wherein said material layer has a surface roughness of <10 Å rms.

47. The method of claim 28, further including the step of removing said remaining portion of said first substrate and said etch stop layer and wherein said material layer has a surface roughness of <10 Å rms.

48. The method of claim 37, further including the step of removing said remaining portion of said first substrate and said etch stop layer and wherein said material layer has a surface roughness of <10 Å rms.

\* \* \* \* \*